United States Patent
Sharpe-Geisler et al.

[11] Patent Number: 5,668,488
[45] Date of Patent: Sep. 16, 1997

[54] INPUT BUFFER FOR A HIGH DENSITY PROGRAMMABLE LOGIC DEVICE

[75] Inventors: Bradley A. Sharpe-Geisler, San Jose; Fabiano Fontana, Santa Clara, both of Calif.

[73] Assignee: Advanced Micro Devices, Inc., Sunnyvale, Calif.

[21] Appl. No.: 341,636

[22] Filed: Nov. 17, 1994

[51] Int. Cl.$^6$ ..................................... H03K 19/084
[52] U.S. Cl. ..................... 327/108; 327/165; 327/206; 327/234; 327/276; 327/382
[58] Field of Search ................... 327/14, 15, 108, 327/165, 234–5, 268, 276, 379, 382, 206

[56] References Cited

U.S. PATENT DOCUMENTS

| | | | |
|---|---|---|---|
| 4,355,284 | 10/1982 | Acker | 327/233 |
| 4,539,489 | 9/1985 | Vaughn | 327/206 |
| 4,617,529 | 10/1986 | Suzuki | 331/57 |
| 5,012,141 | 4/1991 | Tomisawa | 327/276 |
| 5,347,177 | 9/1994 | Lipp | 307/443 |
| 5,396,109 | 3/1995 | Oshiba | 327/233 |

FOREIGN PATENT DOCUMENTS

| | | | |
|---|---|---|---|
| 401231515 | 9/1989 | Japan | 327/206 |
| 403064115 | 3/1991 | Japan | 327/206 |
| 5-183396 | 7/1993 | Japan | 327/206 |
| WO95/26590 | 10/1995 | WIPO | H03K 19/094 |

OTHER PUBLICATIONS

IBM Technical Disclosure Bulletin vol. 36, No. 09A, Sep. 1993; Process Tracking Delay Element p. 87.

*Primary Examiner*—Margaret Rose Wambach
*Attorney, Agent, or Firm*—Fliesler, Dubb, Meyer & Lovejoy, LLP

[57] ABSTRACT

An input buffer which provides compensation for the RC time delay introduced by a switch matrix of a high density programmable logic device (PLD). The input buffer includes circuitry to provide an input threshold which varies to compensate for the RC delay of the switch matrix to produce an output which transitions when a signal input to the switch matrix transitions through a predetermined value.

22 Claims, 6 Drawing Sheets

INPUT BUFFER FOR A HIGH DENSITY PROGRAMMABLE LOGIC DEVICE

BACKGROUND OF THE INVENTION

1. Field of the Invention

The present invention relates to input buffers for integrated circuit devices. More particularly, the present invention relates to input buffers capable of compensating for the RC time delay introduced by a switch matrix of a high density programmable logic device (PLD).

2. Description of the Related Art

FIG. 1 shows a block diagram for a typical high density PLD such as the MACH130 manufactured by Advanced Micro Devices, Inc. As shown, the high density PLD includes four programmable array logic (PAL) blocks 101–104 interconnected by a programmable switch matrix 106. The PAL blocks 101–104 can be viewed as independent PLD devices on the chip, each similar to the popular lower density 22V10 PAL device, also available from Advanced Micro Devices, Inc. The switch matrix 106 connects the PAL blocks to each other and to all I/O pins 11–114 enabling a device, such as the MACH130, to provide six times the logic capability of the 22V10.

FIG. 2 shows greater detail for one quarter of the PLD block diagram of FIG. 1, including PAL block 101 as connected to switch matrix 106. Note that circuit components, such as switch matrix 106 carried forward from FIG. 1 are similarly labeled in FIG. 2, as will be circuit components carried forward in subsequent figures. PAL block 101 receives inputs, such as the 26 inputs shown, from the switch matrix 106 to input buffers 202. Input buffers 202 buffer the signals to AND array and logic allocator circuitry 204 which provides programmable AND and OR logic between the input buffers 202 and output logic macrocells 206.

The output logic macrocells 206 are programmable to provide registered or combinatorial outputs. The outputs of the macrocells 206 are provided to tri-state output buffers 208 and are also provided on feedback lines to the switch matrix 106.

Each tri-state output buffer 208 can be enabled for use as an output buffer, or disabled so that I/O ports 111 can provide input signals to the PLD. Enabling or disabling signals for the tri-state buffers are provided by the AND array and logic allocator circuit 204. When the tri-state output buffers 208 are enabled, outputs are provided from the output buffers 208 through I/O ports 111 as well as through feedback lines to the switch matrix 106. When the output buffers 208 are disabled, input signals from external circuitry are provided through I/O ports 111 to the switch matrix 106. The switch matrix 106 includes circuitry to distribute the signals received from the tri-state output buffers 208, I/O ports 111 and macrocells 206 back to the PAL blocks 101–104.

FIG. 3 shows a cut away view of a portion of the switch matrix 106 as connected to the input of one of the input buffers labeled 302. As shown the switch matrix 106 includes a plurality of pass gates 304 all feeding the input of the input buffer 302. In the switch matrix one pass gate will be enabled to supply a signal such as $V_S$ the input of the input buffer 302 as a signal $V_I$.

As shown by the equivalent circuit for the circuitry of FIG. 3 in FIG. 4, the plurality of pass gates 304 supplying the input buffer 302 create a capacitance C while line resistance creates a resistance R at the input of the input buffer. Thus, an RC delay is added between the signal $V_S$ and the signal $V_I$. Because the RC delay distorts the signal $V_S$ originally received, it is desirable to compensate for any RC delay of the switch matrix in the input buffer to provide an output signal $V_O$ representative of the signal $V_S$ originally input to the switch matrix.

SUMMARY OF THE INVENTION

The present invention provides a buffer capable of providing compensation for the RC delay of the switch matrix which can precede the buffer to more accurately reproduce a signal originally input to the switch matrix.

The buffer of the present invention provides circuitry for measuring the RC delay introduced by a delay circuit, such as a switch matrix, having known resistive and capacitive components based on the signal received from the delay circuit. The buffer of the present invention further provides its output when the signal originally input to the delay circuit, as determined by the signal received from the delay circuit less the RC delay, transitions through a predetermined value.

To compensate for RC delay, the buffer of the present invention provides an input threshold which varies to transition the buffer output when the signal input to the delay circuit transitions through the predetermined value.

To create the variable threshold, one embodiment of the buffer of the present invention utilizes a first inverter in combination with an additional pull up and pull down transistor. Power is provided to the additional pull up and pull down transistors by transistors with gates controlled by second and third inverters. The inputs of the second and third inverters receive a signal provided to the first inverter delayed by an amount set to match the RC delay of the switch matrix.

The buffer of the present invention may further include a noninverting buffer which is driven by the first inverter to provide rapid switching to drive a large capacitive load. The noninverting buffer includes an n-channel pull up transistor with a gate connected to the output of the first inverter and an n-channel pull down transistor with a gate connected to the input of the first inverter. Further, the noninverting buffer may be configured to have an additional pull down transistor with circuitry provided to enable both pull down transistors to pull down a load together, but only one to be enabled with the n-channel pull up transistor turns on to enable fast switching.

To create the variable threshold in another embodiment of the buffer of the present invention, additionaly circuitry is provided to create an input buffer having a variable input threshold.

BRIEF DESCRIPTION OF THE DRAWINGS

Further details of the present invention are explained with the help of the attached drawings in which.

DETAILED DESCRIPTION

The input buffer of the present invention produces an output signal $V_O$ based on a signal $V_S$ originally received by a switch matrix as determined from a signal $V_I$ received at the input of the input buffer. To understand how $V_O$ can be determined from $V_S$ when only $V_I$ is received at the input of the input buffer, it is first helpful to mathematically determine the signal $V_S$ in terms of $V_I$. From the equivalent circuit of FIG. 4, $V_S$ can be determined in terms of $V_I$ using the following equations:

(1) $I=(V_S-V_I)/R$ (2) $I=C(dV_I/dt)$

Solving equations (1) and (2) for $V_S$ in terms of $V_I$ we get the following equation:

(3) $V_S=V_I+RC(dV_I/dt)$

Figure 1:
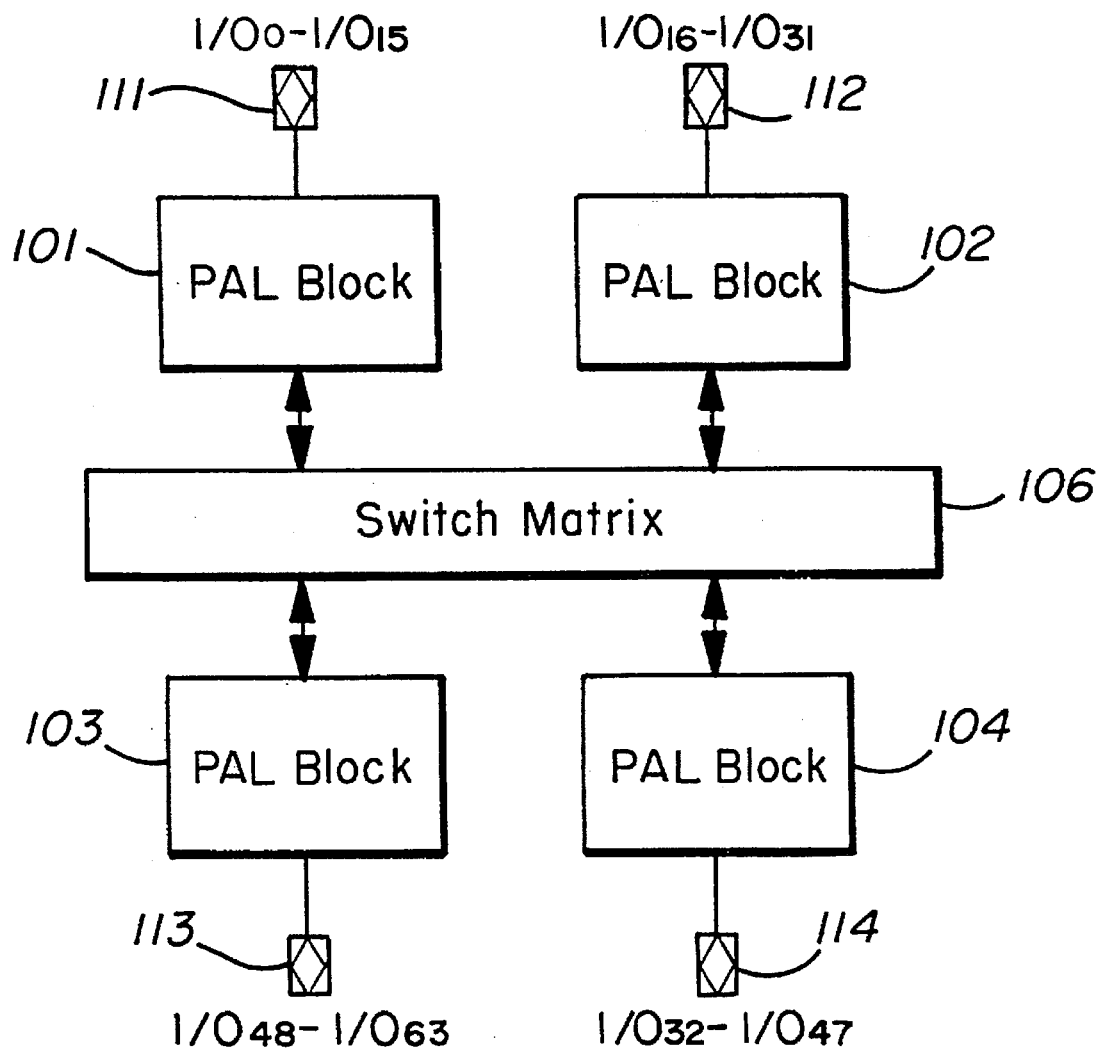
FIG. 1 shows a block diagram for a typical high density programmable logic device (PLD)
Figure 2:
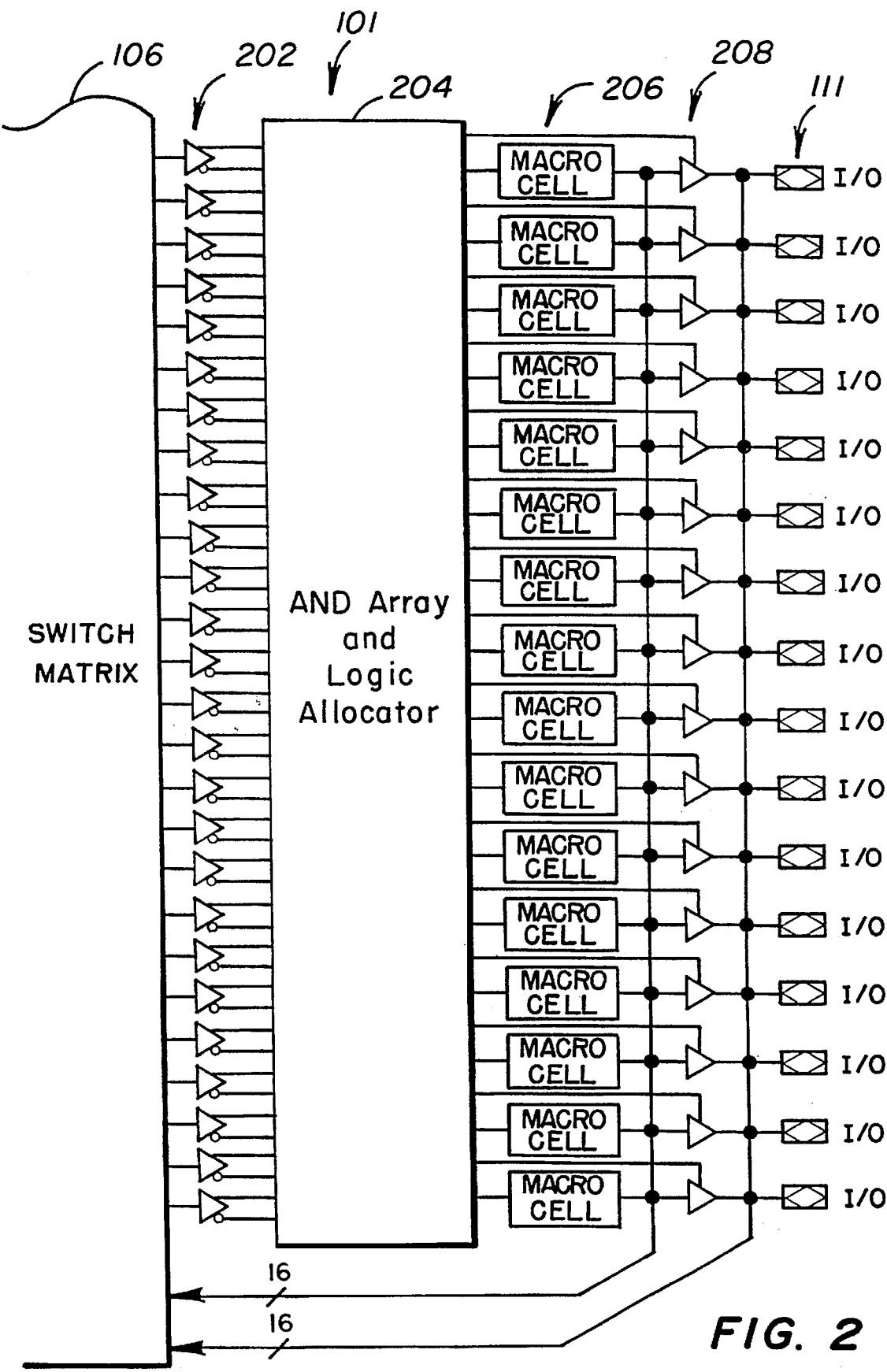
FIG. 2 greater detail for one quarter of the PLD shown in FIG. 1.
Figure 3:
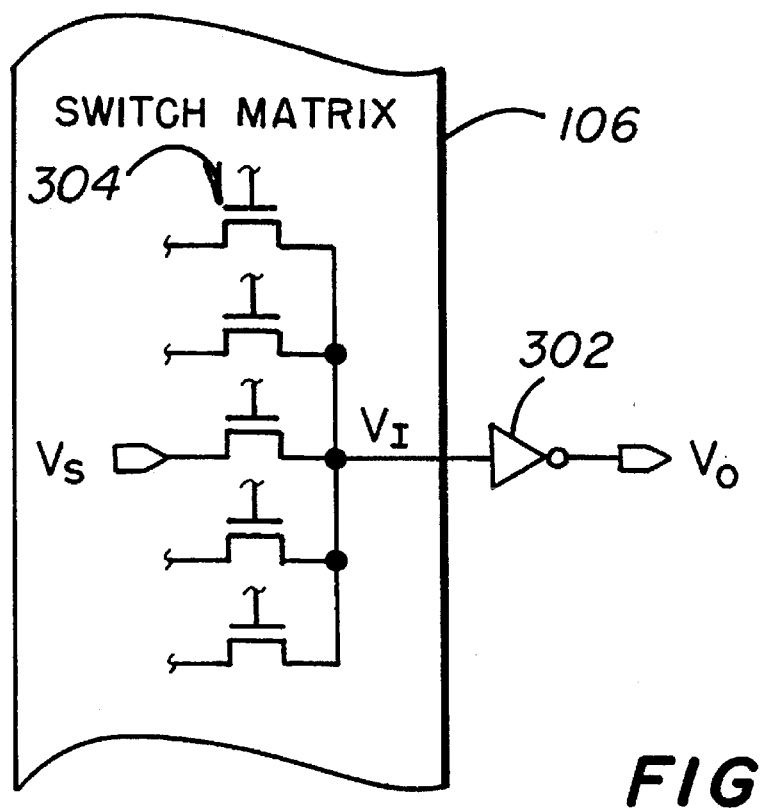
FIG. 3 shows a cut away view of a portion of the switch matrix as connected to the input of one of the input buffers.
Figure 4:
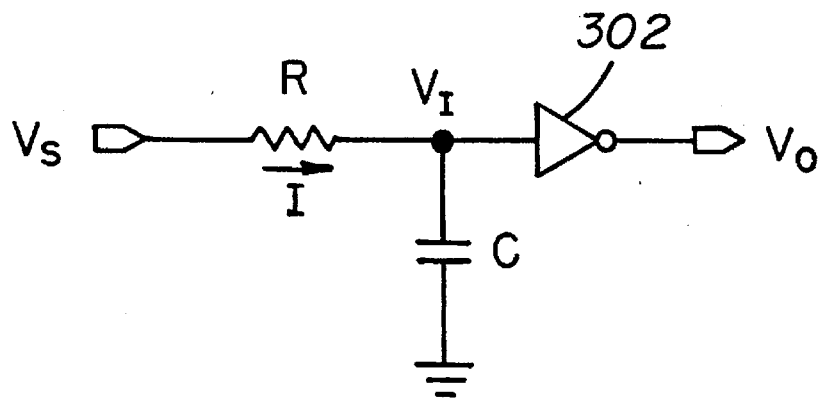
FIG. 4 shows an equivalent circuit for the circuitry shown in FIG. 3.
Figure 5:
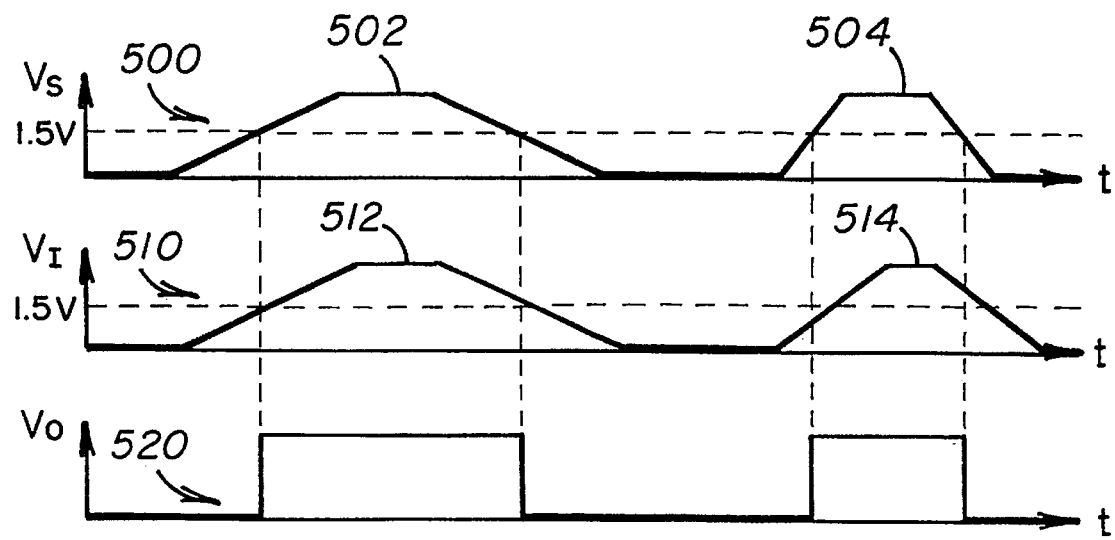
FIG. 5 shows a timing diagram for voltages $V_S$, $V_I$, and $V_O$ of FIG. 4 when a specific $V_S$ signal is received.

Further to understand how $V_S$ can be determined from $V_I$, FIG. 5 provides a timing diagram for voltages $V_S$, $V_I$, and $V_O$ of FIG. 4 when a specific $V_S$ signal 500 is received. In FIG. 5, the $V_S$ signal 500 includes two pulses, a first pulse 502 which switches slowly and has a shallow slope and a second pulse 504 which switches rapidly and has a steep slope. As seen by the resulting $V_I$ signal 510 in FIG. 5, if the signal $V_S$ switches slowly with a shallow slope as in pulse 502, $dV_I/dt$ will have a small value so that little or no RC delay component will exist in equation (3) making $V_I$ approximately equal to $V_S$ as shown in pulse 512. However, when $V_S$ switches rapidly with a steep slope as in pulse 504, $dV_I/dt$ will have a large value so that the RC delay component in equation (3) will be significant as shown by pulse 514. The output of an input buffer typically transitions when an input pulse transitions through a specific voltage, for example 1.5 V. To compensate for any RC delay component of the switch matrix, it is desirable to transition $V_O$ when $V_S$, rather than $V_I$, transitions through 1.5 V. Such a desired $V_O$ signal 520 is shown in FIG. 5, and as shown by the dashed lines, transitions when the $V_S$ signal 500 transitions through 1.5 V.

For the input buffer to provide the $V_O$ signal 520 at its output, it is desirable for the input buffer to have a variable input threshold. For a low to high transition of the $V_S$ pulse 512 or pulse 514, the threshold should be lower than the 1.5 V point on the $V_I$ pulse as shown by where the dashed lines cross pulses 512 and 514. For a high to low transition of the $V_S$ pulse 512 or 514, the threshold should be higher than the 1.5 V point on the $V_I$ pulse as shown by where the dashed lines cross pulses 512 and 514. Further as indicated by where the dashed lines cross $V_I$ pulses 512 and 514 and as can be shown from equation (3), as the $V_S$ pulse slope gets steeper the threshold voltage should be moved farther from the 1.5 V point on the $V_I$ pulse.

Figure 6:
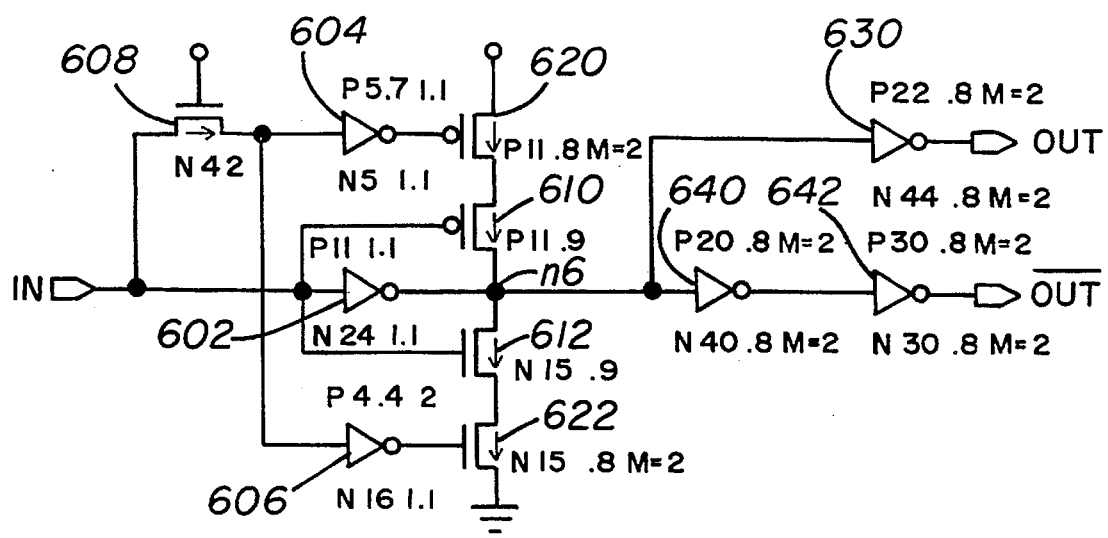
FIG. 6 shows an embodiment of an input buffer of the present invention.

FIG. 6 shows an embodiment of an input buffer of the present invention which utilizes a variable input threshold to produce a $V_O$ signal such as 520 of FIG. 5 from a $V_I$ signal such as 510 output from a switch matrix. The input buffer includes a first inverter 602 which receives an input signal directly from the buffer input (IN). Two additional inverters 604 and 606 are also included which receive an input signal from the input IN indirectly through an RC delay which is set to match the RC delay of the switch matrix.

The matching RC delay is provided by a resistance through transistor 608 and a parasitic capacitance at the input of inverters 604 and 606. Transistor 608 provides a resistive element by having a source to drain path connecting the buffer input IN to the inputs of inverters 604 and 606 and a gate connected to $V_{DD}$.

For transistor symbols in the drawings, a suggested channel type and transistor dimensions are indicated next to the transistor with a p or n indicating channel type followed by channel width and length in microns. An additional M=2 is included to indicate that two such transistors are included and connected identically. For inverters which include CMOS pull up and pull down transistors, channel type and dimensions are included above and below the inverter symbol. Transistor sizes and types are only suggested and may be changed to meet particular design requirements.

For the inverters, the input threshold can be determined based on the ratio of widths of their pull up and pull down transistors. With the transistor sizes indicated, the threshold of inverter 602 is approximately 1.5 V.

To vary the input threshold of the input buffer from the 1.5 V threshold provided by inverter 602 to provide a higher threshold during pull up and a lower threshold during pull down, transistors 610 and 612 are provided. Transistor 610 has a source connected to node n6 and a gate connected to the input IN, while transistor 612 has a drain connected to node n6 and a gate connected to the input IN. As determined from ratios of transistor widths, if transistor 610 is combined with inverter 602, the width of transistor 610 being added to the pull up transistor of inverter 602 to determine transistor ratios, the threshold at the input of inverter 602 changes to a maximum threshold of approximately 2.0 V. Further, if transistor 612 is combined with inverter 602 with the width of transistor 612 being added to the pull down transistor of inverter 602 to determine transistor ratios, the threshold at the input of 602 changes to a maximum threshold of approximately 1.0 V.

To further vary the threshold seen at the input of inverter 602 depending on the slope of an input signal, transistors 620 and 622 supply power to respective transistors 610 and 612 as controlled by the outputs of respective inverters 604 and 606. Transistor 620 has a source connected to $V_{DD}$, a drain connected to the source of transistor 610 and a gate connected to the output of inverter 604. Transistor 622 has a source connected to $V_{SS}$, a drain connected to the source of transistor 612 and a gate connected to the output of inverter 606.

To assure crowbar does not occur, or transistors 610 and 612 are not enabled at the same time, transistors of inverters 604 and 606 are sized so that the threshold of inverter 604 is set greater than the 1.5 V threshold of inverter 602 and the threshold of inverter 606 is set less than the 1.5 V threshold of inverter 602.

Transistors of inverters 604 and 606 are further sized to assure transistors 610 and 612 do not turn on before respective transistors 620 and 622 can turn off when the slope of the input signal is so shallow that no significant RC delay is caused by transistor 608 in combination with the parasitic capacitance of inverters 604 and 606. For transistor 620 to turn off before transistor 610 turns on under the conditions described, the threshold of inverter 604 is set greater than the threshold of inverter 602 in combination with transistor 610. For transistor 622 to turn off before transistor 612 turns on under the conditions described, the threshold of inverter 606 is set less than the threshold of inverter 602 in combination with transistor 612.

For the circuitry of FIG. 6, the threshold of inverter 604 is set to approximately 2.1 V, while the threshold of inverter 606 is set to approximately 0.9 V.

To provide the buffer output (OUT), node n6 is connected through inverter 630. Node n6 is further connected through inverters 640 and 642 to provide an inverting output ($\overline{OUT}$) for the buffer.

In operation, we first assume that the buffer input IN has been held low for a long period of time. With IN low for some time, the output of inverters 604 and 606 will be high turning off transistors 620 and 622. With transistors 620 and 622 off, transistors 610 and 612 will be disabled and inverter 602 will hold node n6 high. With n6 high, the buffer output OUT will be held low by inverter 630 while the inverting output $\overline{OUT}$ will be held high by inverters 640 and 642.

We next assume that the buffer input IN is transitioned from low to high. First, we also assume an input signal $V_I$ is received at IN having a gradually sloping transition from low to high so that $dV_I/dt$ is insignificant. With $dV_I/dt$ insignificant, no substantial delay results from transistor 608 and the parasitic capacitance of inverters 604 and 606. Inverter 606, having a 0.9 V threshold will then turn transistor 622 off before transistor 612, which combined with inverter 602 has a minimum threshold of 1.0 V, can turn on. Inverter 602, with a 1.5 V threshold, will then pull node n6 low alone. Transistor 610, which in combination with inverter 602 has a maximum threshold of 2.0 V, will then be turned off. Finally, inverter 604, which has a 2.1 V threshold will turn transistor 620 on.

Second we assume a steeper sloping transition from low to high at the input IN, or that $dV_I/dt$, or increases slightly. With $dV_I/dt$ increasing, a slight delay is caused by transistor 608 and the parasitic capacitance of inverters 604 and 606. Inverter 606, having a 0.9 V threshold, will then turn off more slowly enabling transistor 612 in combination with transistor 602, having a minimum 1.0 V threshold, to turn on together to pull down node n6 low. After node n6 is pulled low, transistor 622 will be turned off leaving only inverter 602 holding node n6 low. Transistor 612, which in combination with inverter 602 has a minimum threshold of 1.0 V, will then be turned off. Finally, inverter 606, which has a 0.9 V threshold and a delayed input signal will turn transistor 620 on.

Third we assume an even steeper sloping transition from low to high at the input IN, or that $dV_I/dt$ increases further. With $dV_I/dt$ increasing even further, an even greater delay is caused by transistor 608 and the parasitic capacitoance of inverters 604 and 606. Inverter 606 then will turn off even more slowly enabling transistor 612 in combination with transistor 602 to turn on together more quickly so that their combined threshold more closely approaches the mimimum 1.0 V threshold of transistor 612 combined with inverter 602.

As can be seen from the first, second or third scenarios, as the slope of the low to high signal input to IN increases, the effective threshold at the buffer input decreases from the 1.5 V threshold of inverter 602 toward the minimum 1.0 V threshold.

We next assume that the buffer input IN is transitioned from high to low. First, we also assume an input signal $V_I$ is received at IN having a gradually sloping transition from high to low so that $dV_I/dt$ is insignificant. With $dV_I/dt$ insignificant, no substantial delay results from transistor 608 and the parasitic capacitance of inverters 604 and 606. Inverter 604, having a 2.1 V threshold will then turn transistor 620 off before transistor 610, which combined with inverter 602 has a maximum threshold of 2.0 V, can turn on. Inverter 602, with a 1.5 V threshold, will then pull node n6 high alone. Transistor 612, which in combination with inverter 602 has a mimimum threshold of 1.0 V, will then be turned off. Finally, inverter 606, which has a 0.9 V threshold will turn transistor 622 on.

Second we assume a steeper sloping transition from high to low at the input IN, or that $dV_I/dt$ becomes a greater negative value, or decreases more. With $dV_I/dt$ decreasing more, a slight delay is caused by transistor 608 and the parasitic capacitance of inverters 604 and 606. Inverter 604, having a 2.1 V threshold, will then turn off more slowly enabling transistor 610 in combination with transistor 602, having a maximum 2.0 V threshold, to turn on together to pull down node n6 high. After node n6 is pulled high, transistor 620 will be turned off leaving only inverter 602 holding node n6 high. Transistor 612, which in combination with inverter 602 has a minimum threshold of 1.0 V, will then be turned off. Finally, inverter 606, which has a 0.9 V threshold and a delayed input signal will turn transistor 622 on.

Third we assume an even steeper sloping transition from high to low at the input IN, or that $dV_I/dt$ becomes an even greater negative value, or decreases further. With $dV_I/dt$ decreasing further, an even greater delay is caused by transistor 608 and the parasitic capacitoance of inverters 604 and 606. Inverter 604 then will turn off even more slowly enabling transistor 610 in combination with transistor 602 to turn on together more quickly so that their combined threshold more closely approaches the maximum 2.0 V threshold of transistor 612 combined with inverter 602.

As can be seen from the first, second or third scenarios above, as the slope of the high to low signal input to IN decreases or becomes a greater negative value, the effective threshold at the buffer input increases from the 1.5 V threshold of inverter 602 toward the minimum 2.0 V threshold.

Thus, with the circuitry of FIG. 6 node n6 provides a signal which is the inverse of a signal such as the $V_O$ signal 520 of FIG. 5 when a signal such as the $V_I$ signal 510 is received at the buffer input IN enabling cancellation of the effect of any RC delay between signals $V_S$ and $V_I$ of FIG. 5. Inverter 630 then inverts the signal at node n6 to provide the output OUT of the buffer similar to $V_O$ of FIG. 5, while the inverse of the output signal OUT is provided by inverters 640 and 642 connected to node n6 to produce the inverting output signal $\overline{OUT}$.

Figure 7:
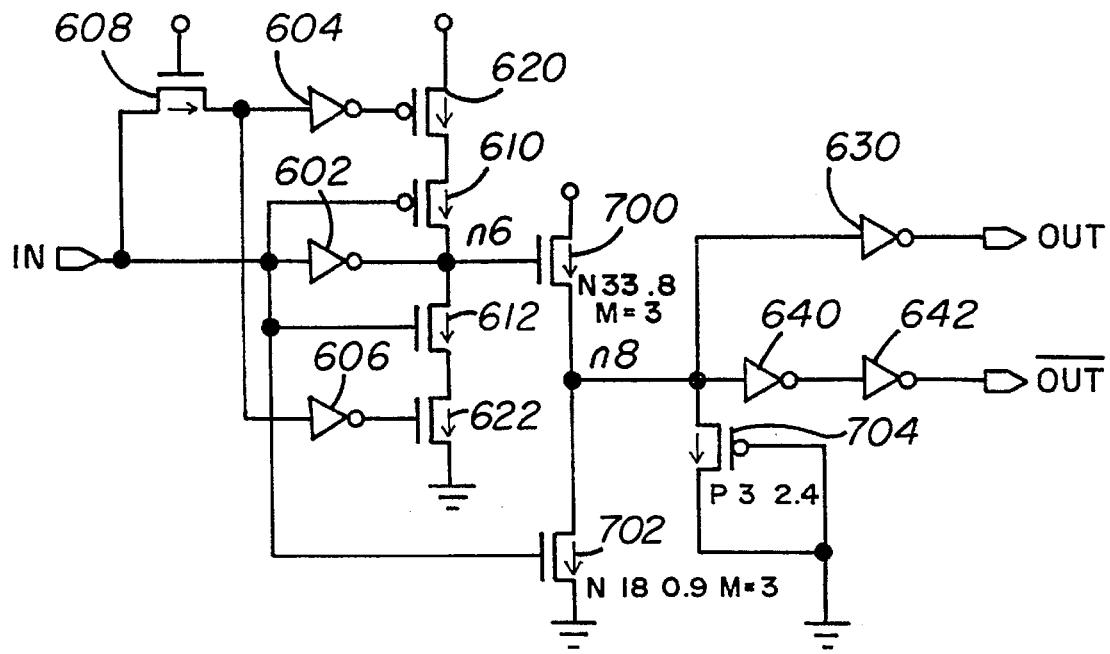
FIG. 7 shows modifications to the circuitry of FIG. 6 to include a noninverting buffer to increase switching speed.

FIG. 7 shows modifications to the circuitry of FIG. 6 to include a noninverting buffer composed of transistors 700 and 702 and a biasing transistor 704. Transistor sizes are shown for transistors 700, 702 and 704 similar to FIG. 6. Components carried over from FIG. 6 have suggested transistor sizes as indicated in FIG. 6.

The noninverting buffer is added between node n6 and the inputs of inverters 640 and 640 and node n8 to enables faster switching and the ability to drive a larger load provided by the n-channel pull up transistor 700 as opposed to a p-channel transistor utilized in invertering buffers. Transistor 700 of the noninverting buffer has a gate connected to node n6, a drain connected to $V_{DD}$ and a source connected to the inputs of inverters 630 and 640 at node n8. Transistor 702 of the noninverting buffer has a gate connected to the input IN a drain connected to the node n8 and a source connected to $V_{SS}$.

Addition of transistor 704 provides biasing of the input of inverter 640 to enable faster operation. Transistor 704 has a gate connected to its drain, a source connected to node n8 and a drain connected to $V_{SS}$.

Figure 8:
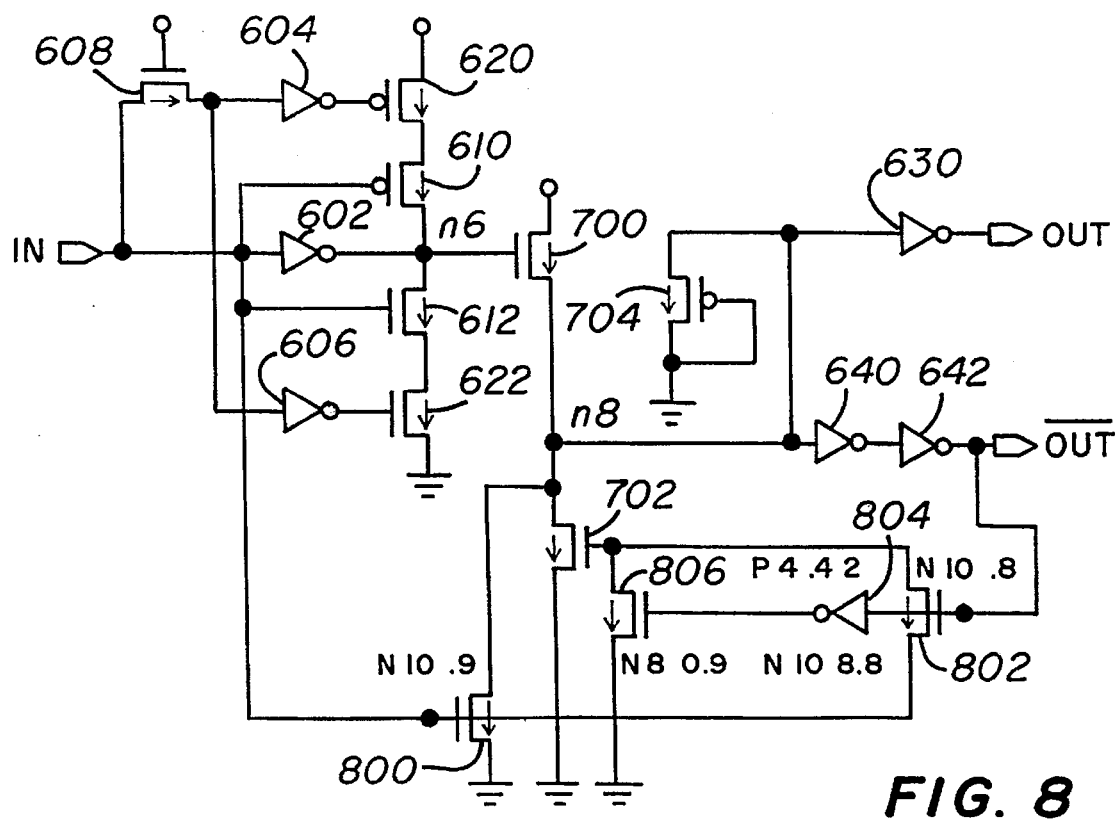
FIG. 8 shows modifications to the circuitry of FIG. 7 to reduce crowbar between transistor of the noninverting buffer.

FIG. 8 shows modifications to the circuitry of FIG. 7 to reduce power consumption of the noninverting buffer occurring when transistors 700 and 702 turn on together, or when crowbar occurs. As with FIG. 7, transistor sizes are shown for newly added components in FIG. 8 while components carried over from previous figures have suggested transistor sizes as previously indicated.

The added circuitry includes a transistor 800 having a gate connected to the input IN, a drain connected to node n8 and a source connected to $V_{SS}$. Transistor 702 has a source to drain path connecting node n8 to $V_{SS}$ as in FIG. 7, but the gate of transistor 702, unlike in FIG. 7, is connected through a pass gate transistor 802 to the input IN. An additional transistor 806 is further added in FIG. 8 which has a source to drain path connecting the gate of transistor 702 to $V_{SS}$. Feedback from the inverting output $\overline{OUT}$ is provided to the gate of transistor 802 and is further provided through inverter 804 to the gate of transistor 806.

In operation with the added circuitry of FIG. 8 we first assume that the buffer input IN has been low for some time. With the input IN low, node n6 will be high turning on transistor 700 to pull node n8 high. Transistor 800 will be turned off. With node n8 high, the inverting output $\overline{OUT}$ will also be high. With the inverting output $\overline{OUT}$ high, transistor 802 will be turned on and transistor 806 will be turned off enabling voltage at the input IN to be provided to the gate of transistor 702. With the input IN low, transistor 702 will be turned off, and will be further enabled to transition to on when the input IN changes states.

We next assume that the buffer input transitions from low to high. With the input IN going high, node n6 will be pulled low turning transistor 700 off. Transistors 800 and 802 will then be turned on together to enable a rapid pull down of node n8. With node n8 low, the inverting output $\overline{OUT}$ will then go low turning off transistor 802 and turning on transistor 806 to disable transistor 702. With transistor 702 off, only transistor 800 holds node n8 low.

With only transistor 800 holding node n8 low, transistor 700 can easily pull up node n8 by overcoming transistor 800 when the input IN changes states. Transistor 700 is larger than transistor 702 enabling pull up of node n8 by transistor 700 even if transistor 702 were holding node n8 low as in FIG. 7. However, transistor 800 is smaller than transistor 702 enabling transistor 700 to even more easily pull up node n8, thus reducing any crowbar effect and enabling a greater switching speed than the circuitry of FIG. 7.

Finally we assume that the buffer input transitions from high back to low. With the input IN going low, node n6 will be pulled high turning transistor 700 on. Transistor 700 then sources more current than transistor 800 sinks to pull up node n8. With the input IN further going low, transistor 800 will turn off. Transistor 700 will then continue pulling up node n8 causing the inverting output $\overline{OUT}$ to go high. With the inverting output $\overline{OUT}$ high, transistor 802 will turn on and transistor 806 will turn off enabling the input IN to be provided to the gate of transistor 702. With the input IN low, transistor 702 will be turned off, and will be enabled to transition when the input IN transitions again. We now have returned to operation conditions as described above when the input IN has been low for some time.

Figure 9:
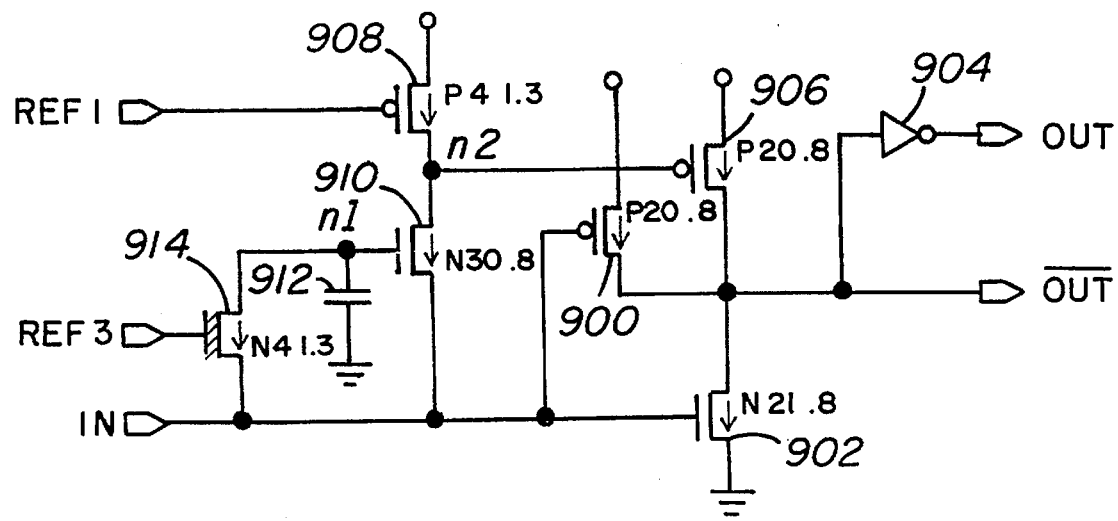
FIG. 9 shows another embodiment of an input buffer of the present invention.

FIG. 9 shows another embodiment of the input buffer of the present invention which utilizes a variable input threshold to produce a $V_O$ signal such as 520 of FIG. 5 from a $V_I$ signal such as 510 output from the switch matrix.

The input buffer of FIG. 9 includes an inverter made up of a small p-channel pull up transistor 900 and a larger n-channel pull down transistor 902. An input signal IN is provided to directly to the gates of transistors 900 and 902. The source of transistor 900 is connected to $V_{DD}$, while its drain is connected to the drain of transistor 902. The source of transistor 902 is connected to ground. The connon drains of transistors 900 and 902 are provided directly to form an output $\overline{OUT}$ while being provided through an inverter 902 to provided an output OUT.

The input buffer of FIG. 9 further includes a p-channel transistor 906 connected similar to the p-channel transistor 900 with a source connected to $V_{DD}$ and a drain connected to the drain of transistor 900. The gate of transistor 906 is connected to a p-channel current source transistor 908 to form a node n2. The current source transistor 908 has a gate controlled by a signal REF1.

Additionally connected to node n2 is a transistor 910 connected in a cascode configuration. Cascode 910 has a source connected to receive the input IN, a drain connected to node n2 and a gate forming node n1. Connected to node n1 to ground is a capacitor 912. Additionally connected to node n1 is an additional cascode transistor 914. Transistor 914 has a drain connected to node n1, a source receiving the signal IN and a gate connected to a reference voltage REF3. The hatched lines on the gate of transistor 914 indicate that transistor 914 is configured in a depletion mode so that a negative voltage is required to turn it off.

Note that a cascode transistor is a transistor defined by being turned on and off by varying voltage applied to the source with the gate voltage fixed, rather than varying the gate voltage. In a cascode transistor with $(v_g-v_s)>V_t$, wherein $v_g$ is the gate voltage, $V_s$ is the source voltage, and $V_t$ is the threshold voltage of the transistor, the cascode transistor will turn on. With $(v_g-v_s)<v_t$, the cascode transistor will turn off.

In operation, we first assume that the input IN is low. With IN low, the source of transistor 914 will be well below the reference REF3 keeping it turned on and pulling node n1 low. With node n1 low, transistor 910 will be off. Current source 908 will, thus, pull up node n2 keeping transistor 906 off. With IN low, transistor 900 will further be off and transistor 902 will be on pulling $\overline{OUT}$ low and OUT high.

We next assume that the input IN transitions from low to high quickly. With transistor 914 configured as shown, it provides a high resistance. Thus, with IN transitioning from low to high quickly, node n1 will not be pulled up quickly to turn off transistor 910 and allow node n2 to be pulled low. Thus, transistor 900 will turn on alone, while transistor 902 turns off. With transistors 900 and 902 acting as an inverter without transistor 906, the threshold of the input buffer of FIG. 9 remains low, 1.1 V for instance.

We next assume that the input IN transitions from low to high more slowly. With IN transitioning from low to high more slowly, node n1 will rise more proportionately to the input. Node n1 going high allows transistor 910 to turn on to pull down node n2 more in proportion to pull up of the input. Transistor 906 and 900 are thus operated more in combination. With transistor 906 and 900 operating more in combination with transistor 902, the threshold of the input buffer rises proportionately from the 1.1 V threshold suggested above.

We next assume that IN is high. With IN high, transistor 914 will be off and node n1 will be high turning on transistor 910. Because IN is high, n2 will be high turning of transistor 906. Transistor 900 will further be off and transistor 902 will be on.

With a rapid transition from high to low, n1 will stay high and will not drop right away. Transistor 910 will remain on allowing node n2 to be pulled down quickly. Transistors 906 and 900 will therefore turn on together to pull up the output $\overline{OUT}$. With transistors 906, 900 and 902 together forming an inverter, the threshold of the input buffer of FIG. 9 will be much higher than the 1.1 V suggested above.

With a slower transition from high to low, n1 will drop more in proportion to the input IN. Transistor 910 will, therefore, more rapidly turn off, allowing transistor 908 to pull up node n2 preventing transistor 906 from turning on as much in combination with transistor 900. Thus, the threshold of the input buffer of FIG. 9 is proportionately lowered toward the 1.1 V threshold minimum.

Figure 10:
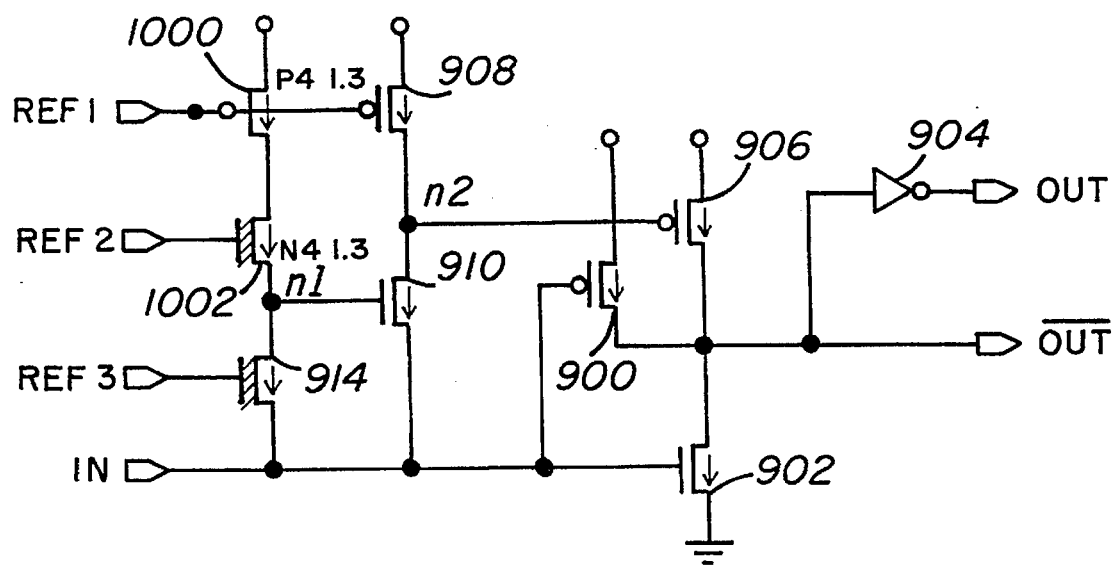
FIG. 10 shows modifications to the circuitry of FIG. 9 to increase operation speed and to provide zero power operation.

FIG. 10 shows modifications to the circuitry of FIG. 9 to increase operation speed and to provide zero power operation. Components carried over from FIG. 9 have suggested transistor sizes as indicated in FIG. 9.

FIG. 10 simply adds a current source transistor 1000 having a gate connected to REF1 similar to transistor 908. The drain of transistor 100 is connected to the drain of an additionally added transistor 1002 which has a source connected to node n1. The gate of transistor 1002 is connected to a reference REF2 slightly higher than REF3. The hatched lines on the gate of transistor 1002, like transistor 914 indicate that transistor 914 is configured in a depletion mode so that a negative voltage is required to turn it off. Capacitor 912 has been removed from FIG. 9 because it is assumed that the gate of transistor 910 provides sufficient capacitance for operation.

In operation, additional transistors 1000 and 1002 simply enable node n1 to be pulled up to a higher voltage when transistor 914 is off to further turn on transistor 910 increasing operation speed. Transistors 1000 and 1002 also provide further power preventing current from being drawn to provide lower power operation.

Although the invention has been described above with particularity, this was merely to teach one of ordinary skill in the art how to make and use the invention. Many modifications will fall within the scope of the invention, as that scope is defined by the following claims.

What is claimed is:

1. A buffer having an input and an output, the input receiving a second data signal from delay circuit which forms the second data signal by introducing an RC delay in a first data signal, the buffer comprising:
   means for measuring a rate of change in voltage with respect to time ($dV_I/dt$) of the second data signal; and
   means for changing the threshold at the buffer input from a first threshold to a threshold having a value altered from the first threshold in proportion to a magnitude of the rate $dV_I/dt$ when the second signal changes states, so that the buffer output transitions at time intervals corresponding to when the first data signal transitions through a predetermined value.

2. The buffer of claim 1,
   wherein the means for changing the threshold at the buffer input comprises:
      a first inverter having an input and an output;
      a pull up transistor having a gate connected to the input of the first inverter and a current path having a first end connected to the output of the first inverter and a second end;
      a pull up switching transistor having a gate and a current path having a first end connected to an upper power supply ($V_{DD}$) and a second end connected to a second end of the current path of the pull up transistor;
      a pull down transistor having a gate connected to the input of the first inverter and a current path having a first end connected the output of the first inverter and a second end; and
      a pull down switching transistor having a gate and a current path having a first end connected to a lower power supply ($V_{SS}$) and a second end connected to the second end of the current path of the pull down transistor, and
   wherein the means for measuring comprises:
      a resistive element having a first end connected to the input of the first inverter and a second end;
      a second inverter having an input connected to the second end of the resistive element and an output connected to the gate of the pull up switching transistor; and
      a third inverter having an input connected to the second end of the resistive element and an output connected to the gate of the pull down switching transistor.

3. The buffer of claim 2 wherein the resistance element has a resistance set so that in combination with parasitic capacitances provided at the inputs of the second and third inverters it provides an RC delay matching the RC delay of the delay circuit.

4. The buffer of claim 1,
   wherein the means for changing the threshold comprises:
      a first inverter having an input and an output;
      a pull up transistor having a gate connected to the input of the first inverter and a source to drain path having a first end connected to the output of the first inverter and a second end; and
      a pull up switching transistor having a gate and a source to drain path coupling $V_{DD}$ to the second end of the source to drain path of the pull up transistor, and
   wherein the means for measuring comprises:
      a resistive element having a first end connected to the input of the first inverter and a second end; and
      a second inverter having an input connected to the second end of the resistive element and an output connected to the gate of the pull up switching transistor.

5. The buffer of claim 1,
   wherein the means for changing the threshold comprises:
      a first inverter having an input and an output;
      a pull down transistor having a gate connected to the input of the first inverter and a source to drain path having a first end connected the output of the first inverter and a second end; and
      a pull down switching transistor having a gate and a source to drain path coupling $V_{SS}$ to the second end of the source to drain path of the pull down transistor, and
   wherein the means for measuring comprises:
      a resistive element having a first end connected to the input of the first inverter and a second end; and
      a second inverter having an input connected to the second end of the resistive element and an output connected to the gate of the pull down switching transistor.

6. The buffer of claim 1,
   wherein the means for changing the threshold comprises:
      an inverter having an input and an output; and
      a pull up transistor having a source to drain path coupling $V_{DD}$ to the inverter output, and a gate forming a first node, and
   wherein the means for measuring comprises:
      a current source transistor having a source to drain path coupling $V_{DD}$ to the first node, and a gate connected to a reference;

a switching transistor having a source to drain path coupling the first node to the inverter input, and having a gate; and a pass transistor having a source to drain path coupling the inverter input to the gate of the switching transistor, and having a gate connected to a reference.

7. A buffer having an input and an output, the buffer receiving a second data signal having a voltage changing at a rate with respect to time ($dV_I/dt$) as the second data signal transitions between a first and a second state, the second data signal being received from a delay circuit which forms the second data signal by introducing RC delay in a first data signal, the buffer comprising:

means for decreasing a threshold at the input of the buffer from a first threshold to a threshold having a value less than the first threshold in proportion to the rate $dV_I/dt$ when the voltage transitions form the first state to the second state; and means for increasing the threshold at the input of the buffer from the first threshold to a threshold having a value greater than the first threshold in proportion to the rate $dV_I/dt$ when the voltage transitions from the second state to the first state, wherein the means for increasing and the means for decreasing enable the buffer output to transition at time intervals corresponding to when the first data signal transitions through a predetermined value.

8. The buffer of claim 7 wherein the buffer includes a first inverter having an input and an output and the means for decreasing a threshold comprises:

a pull up transistor having a gate connected to the input of the first inverter and a current path having a first end connected to the output of the first inverter and a second end;

a pull up switching transistor having a gate and a current path having a first end connected to an upper power supply ($V_{DD}$) and a second end connected to a second end of the current path of the pull up transistor;

a second inverter having an input connected through a resistive element to the input of the first inverter and an output connected to the gate of the pull up switching transistor.

9. The buffer of claim 8 wherein the means for increasing the threshold comprises:

a pull down transistor having a gate connected to the input of the first inverter and a current path having a first end connected the output of the first inverter and a second end; and a pull down switching transistor having a gate and a current path having a first end connected to a lower power supply ($V_{SS}$) and a second end connected to the second end of the current path of the pull down transistor; and a third inverter having an input connected through a resistive element to the input of the first inverter and an output connected to the gate of the pull down switching transistor.

10. A buffer comprising:

a first inverter having an input and an output;

a first n-channel transistor having a gate connected to the output of the first inverter and a source to drain path connecting an upper power supply ($V_{DD}$) to a first node;

a second n-channel transistor having a gate connected to the input of the first inverter and a source to drain path coupling the first node to a lower power supply ($V_{SS}$);

a third n-channel transistor having a source to drain path coupling the first node to the lower power supply ($V_{SS}$), and having a gate;

a first enabling transistor having a source to drain path coupling the gate of the third n-channel transistor to the input of the first inverter, and having a gate;

a second enabling transistor having a source to drain path coupling the gate of the third n-channel transistor to the lower power supply ($V_{SS}$), and having a gate;

a pair of series inverters having an input connected to the first node and an output connected to the gate of the first enabling transistor; and a second inverter having an input connected to the output of the series inverters and an output connected to the gate of the second enabling transistor.

11. A buffer comprising:

a first inverter having an input and an output;

a pull up transistor having a gate connected to the input of the first inverter and a current path having a first end connected to the output of the first inverter and a second end;

a pull up switching transistor having a gate and a current path having a first end connected to an upper power supply ($V_{DD}$) and a second end connected to a second end of the current path of the pull up transistor;

a pull down transistor having a gate connected to the input of the first inverter and a current path having a first end connected the output of the first inverter and a second end; and a pull down switching transistor having a gate and a current path having a first end connected to a lower power supply ($V_{SS}$) and a second end connected to the second end of the current path of the pull down transistor;

a second inverter having an input connected through a resistive element to the input of the first inverter and an output connected to the gate of the pull up switching transistor; and a third inverter having an input connected through a resistive element to the input of the first inverter and an output connected to the gate of the pull down switching transistor.

12. The buffer of claim 11 wherein the second inverter has a threshold greater than the maximum threshold of the first inverter combined with the pull up transistor and wherein the third inverter has a threshold less than the minimum threshold of the second inverter combined with the pull down transistor.

13. The buffer of claim 11 further comprising:

a first n-channel transistor having a gate connected to the output of the first inverter and a source to drain path connecting an upper power supply ($V_{DD}$) to a first node;

a second n-channel transistor having a gate connected to the input of the first inverter and a source to drain path coupling the first node to a lower power supply ($V_{SS}$);

a third n-channel transistor having a source to drain path coupling the first node to the lower power supply ($V_{SS}$), and having a gate;

a first enabling transistor having a source to drain path coupling the gate of the third n-channel transistor to the input of the first inverter, and having a gate;

a second enabling transistor having a source to drain path coupling the gate of the third n-channel transistor to the lower power supply ($V_{SS}$), and having and a gate;

a pair of series inverters having an input connected to the first node and an output connected to the gate of the first enabling transistor; and a fourth inverter having an input connected to the output of the series inverters and an output connected to the gate of the second enabling transistor.

14. The buffer of claim 11, wherein the second inverter has a threshold greater than the first inverter and wherein the third inverter has a threshold less than the first inverter.

15. An input buffer for a programmable logic device, the input buffer having an input receiving a data signal from a switch matrix which introduces a given RC time delay in the data signal and an output, the input buffer comprising:

a first inverter having an input forming the input of input buffer and an output;

a pull up transistor having a gate connected to the input of the first inverter and a current path having a first end connected to the output of the first inverter and a second end;

a pull up switching transistor having a gate and a current path having a first end connected to an upper power supply ($V_{DD}$) and a second end connected to a second end of the current path of the pull up transistor;

a pull down transistor having a gate connected to the input of the first inverter and a current path having a first end connected the output of the first inverter and a second end;

a pull down switching transistor having a gate and a current path having a first end connected to a lower power supply ($V_{SS}$) and a second end connected to the second end of the current path of the pull down transistor;

a resistance transistor having a gate connected to the upper power supply ($V_{DD}$) and a current path providing a resistance having a first end connected to the input of the first inverter and a second end;

a second inverter having an input providing a parasitic capacitance and a threshold greater than a threshold of the first inverter and the maximum threshold of the first inverter combined with the pull up transistor, the input of the second inverter being connected to the second end of the current path of the resistance transistor, the second inverter having an output connected to the gate of the pull up switching transistor; and a third inverter having an input providing a parasitic capacitance and a threshold less than the threshold of the first inverter and the minimum threshold of the second inverter combined with the pull down transistor, the input of the third inverter being connected to the second end of the current path of the resistance transistor such that the parasitic capacitance at the input of the third inverter combined with the resistance proviced by the resistance transistor and parasitic capacitance of the second inverter provides an RC delay matching the given RC delay of the switch matrix, the third inverter having an output connected to the gate of the pull down switching transistor.

16. The buffer of claim 15 further comprising:

a first n-channel transistor having a gate connected to the output of the first inverter and a source to drain path connecting an upper power supply ($V_{DD}$) to a first node;

a second n-channel transistor having a gate connected to the input of the first inverter and a source to drain path coupling the first node to a lower power supply ($V_{SS}$);

a third n-channel transistor having a source to drain path coupling the first node to the lower power supply ($V_{SS}$), and having a gate;

a first enabling transistor having a source to drain path coupling the gate of the third n-channel transistor to the input of the first inverter, and having a gate;

a second enabling transistor having a source to drain path coupling the gate of the third n-channel transistor to the lower power supply ($V_{SS}$), and having and a gate;

a pair of series inverters having an input connected to the first node and an output connected to the gate of the first enabling transistor; and a fourth inverter having an input connected to the output of the series inverters and an output connected to the gate of the second enabling transistor.

17. A buffer having an input and an output, the buffer comprising:

a PMOS pull up transistor having a gate coupled to the buffer input, and a source to drain path coupling $V_{DD}$ to the buffer output;

an NMOS pull down transistor having a gate coupled to the buffer input, and a source to drain path coupling the buffer output to $V_{SS}$;

a second PMOS pull up transistor having a source to drain path coupling $V_{DD}$ to the buffer output, and having a gate forming a first node;

a PMOS current source transistor having a source to drain path coupling $V_{DD}$ to the first node, and a gate connected to a first reference;

an NMOS switching transistor having a source to drain path coupling the first node to the buffer input, and having a gate; and an NMOS pass transistor which is a depletion mode device, the NMOS pass transistor having a source to drain path coupling the buffer input to the gate of the NMOS switching transistor, and having a gate connected to a second reference.

18. The buffer of claim 17, further comprising:

a second PMOS current source transistor having a source to drain path coupled on a first end to $V_{DD}$ and having a second end, and having a gate connected to the first reference; and a second NMOS pass transistor having a source to drain path coupling the second end of the source to drain path of the second PMOS current source transistor to the gate of the NMOS switching transistor, and having a gate connected to a third reference.

19. A buffer having an input and an output, the buffer comprising:

an inverter having an input coupled to the buffer input and an output coupled to the buffer output; and a pull up transistor having a source to drain path coupling $VD_{DD}$ to the buffer output, and having a gate forming a first node;

a current source transistor having a source to drain path coupling $V_{DD}$ to the first node, and a gate connected to a reference;

a switching transistor having a source to drain path coupling the first node to the buffer input, and having a gate; and a pass transistor having a source to drain path coupling the buffer input to the gate of the switching transistor, and having a gate connected to a reference.

20. The buffer of claim 19, wherein the current source transistor and the pull up transistor are PMOS transistors, wherein the switching transistor and pass transistor are NMOS transistors, and wherein the pass transistor is a depletion mode transistor.

21. The buffer of claim 19, wherein the buffer input is connected to a delay circuit having an RC delay, and wherein the size of the pass transistor is set so that the source to drain path of the pass transistor provides a given resistance so that with the gate of the switching transistor providing a parasitic capacitance, a combination of the given resistance and the parasitic capacitance provides a delay matching the RC delay of the delay circuit.

22. The buffer of claim 19, further comprising:

a second current source transistor having a source to drain path with a first end coupled to $V_{DD}$ and a second end, and having a gate coupled to a reference; and a second pass transistor having a source to drain path coupling the second end of the source to drain path of the second current source transistor to the gate of the switching transistor, and having a gate connected to a reference.

* * * * *